US005759738A

United States Patent [19]

[11] Patent Number: 5,759,738

[45] Date of Patent: Jun. 2, 1998

Tsuno et al.

[54] IMAGE RECEIVING SHEET AND IMAGE FORMING METHOD

[75] Inventors: Shinji Tsuno; Naoya Imamura, both of Shizuoka, Japan

[73] Assignee: Fuji Photo Film Co., Ltd., Kanagawa, Japan

[21] Appl. No.: 672,563

[22] Filed: Jun. 28, 1996

[30] Foreign Application Priority Data

Jun. 30, 1995 [JP] Japan .................................... 7-187870

[51] Int. Cl.$^6$ ................................ G03C 8/52; G03F 7/36

[52] U.S. Cl. .......................... 430/200; 430/258; 430/259; 430/257; 430/262; 430/263; 430/964; 428/483; 503/227

[58] Field of Search .................................... 430/200, 201, 430/259, 263, 254, 262, 964, 258, 257; 428/483; 503/227

[56] References Cited

U.S. PATENT DOCUMENTS 4,766,053 8/1988 Shinozaki et al. ...................... 430/263
5,071,502 12/1991 Hashimoto et al. .................... 430/200
5,457,000 10/1995 Defieuw et al. ........................ 430/200
5,534,383 7/1996 Takahashi et al. ...................... 430/200
5,580,693 12/1996 Nakajima et al. ...................... 430/200
5,587,272 12/1996 Grossa et al. .......................... 430/263
5,607,809 3/1997 Nakamura et al. ...................... 430/257

*Primary Examiner*—Richard L. Schilling
*Attorney, Agent, or Firm*—Birch, Stewart, Kolasch & Birch, LLP

[57] ABSTRACT

An image receiving sheet having a support sheet, an intermediate layer and an image receiving layer, wherein the intermediate layer comprises a polymer and a plasticizer having at least one ester bonds and molecular weight of 700 to 3,000. Otherwise, an image receiving sheet having a support sheet and an image receiving layer wherein the image receiving layer comprises a polymer and the plasticizer. A heat sensitive ink sheet has a heat sensitive ink layer which is formed of a heat sensitive ink material comprising colored pigment and thermoplastic resin such as amorphous organic polymer. An image forming method is conducted by using the heat sensitive ink sheet and one of the image receiving sheets by area gradation by the use of a thermal head or laser beam.

11 Claims, 5 Drawing Sheets

IMAGE RECEIVING SHEET AND IMAGE FORMING METHOD

FIELD OF THE INVENTION

This invention relates to an image forming method, and an image receiving sheet and a composite of a heat sensitive ink sheet and the image receiving sheet which are favorably employable for the image forming method. In more detail, the invention relates to a image forming method for forming a multicolor on the image receiving sheet by area gradation using a thermal head or laser beam.

BACKGROUND OF THE INVENTION

Heretofore, there have been known two methods for thermal transfer recording for the preparation of a multicolor image which utilize a thermal head printer, that is, a sublimation dye transfer recording method and a fused ink transfer recording method.

The sublimation dye transfer recording method comprises the steps of superposing on an image receiving sheet an image transfer sheet which is composed of a support and an image transfer layer comprising a sublimation ink and a binder and imagewise heating the support of the transfer sheet to sublimate the sublimation ink to form an image on the image receiving sheet. A multicolor image can be prepared using a number of color transfer sheets such as a yellow transfer sheet, a magenta transfer sheet, and a cyan transfer sheet.

The sublimation dye transfer recording method, however, has the following drawbacks:

1) The gradation of image is mainly formed of variation of the sublimated dye concentration, which is varied by controlling the amount of sublimation of the dye. Such gradation is appropriate for the preparation of a photographic image, but is inappropriate for the preparation of a color proof which is utilized in the field of printing and whose gradation is formed of dots, lines, or the like, that is, area gradation.
2) The image formed of sublimated dye has poor edge sharpness, and a fine line shows thinner density on its solid portion than a thick line. Such tendency causes serious problem in the quality of character image.
3) The image of sublimated dye is poor in endurance. Such image cannot be used in fields which require multicolor images resistant to heat and light.
4) The sublimation dye transfer recording shows sensitivity lower than the fused ink transfer recording. Such low sensitive recording method is not preferably employable in a high speed recording method utilizing a high resolution thermal head, of which development is expected in the future.
5) The recording material for the sublimation dye transfer recording is expensive, as compared with the recording material for the fused ink transfer recording.

The fused ink transfer recording method comprises the steps of superposing on an image receiving sheet an image transfer sheet having support and a thermal fusible transfer layer which comprises a coloring material (e.g., pigment or dye) and imagewise heating the support of the transfer sheet to portionwise fuse the transfer layer to form and transfer an image onto the image receiving sheet. A multicolor image also can be prepared using a number of color transfer sheets.

The fused ink transfer recording method is advantageous in the sensitivity, cost, and endurance of the formed image, as compared with the sublimation dye transfer recording method. It, however, has the following drawbacks:

The color image prepared by the fused ink transfer recording method is poor in its quality, as compared with the sublimation dye transfer recording method. This is because the fused ink transfer recording utilizes not gradation recording but binary (i.e., two valued) recording. Therefore, there have been reported a number of improvements on the fusible ink layer of the fused ink transfer recording method for modifying the binary recording to give gradation recording so that a color image having multi-gradation is prepared by the fused ink transfer recording method. The basic concept of the heretofore reported improvement resides in portionwise (or locally) controlling the amount of the ink to be transferred onto the image receiving sheet. In more detail, the mechanism of transfer of the ink in the fused ink transfer recording method is as follows; under heating by the thermal head, the viscosity of the ink layer at the site in contact with the thermal head lowers and the ink layer tends to adhere to the image receiving sheet, whereby the transfer of the ink takes place. Therefore, the amount of the transferred ink can be controlled by varying degree of elevation of temperature on the thermal head so that the cohesive failure in the ink layer is controlled and the gamma characteristic of the transferred image is varied. Thus, the optical density of the transferred ink image is portionwise varied, and accordingly, an ink image having gradation is formed. However, the optical density of a fine line produced by the modified fused ink transfer recording is inferior to that produced by the sublimation dye transfer recording method. Moreover, the optical density of a fine line produced by the modified fused ink transfer recording method is not satisfactory.

Further, the fused ink transfer recording method has other disadvantageous features such as low resolution and poor fixation of the transferred ink image. This is because the ink layer generally uses crystalline wax having a low melting point as the binder, and the wax tends to spread on the receiving sheet in the course of transferring under heating. Furthermore, the crystalline wax scarcely gives a transparent image due to light scattering on the crystalline phase. The difficulty in giving a transparent image causes serious problems in the preparation of a multicolor image which is formed by superposing a yellow image, a magenta image, and a cyan image.

EP 064974A discloses a transfer image forming method which enables the formation of multi-gradation image utilizing area gradation according to binary recording. The method is referred to as a thin layer heat-sticking-peeling method. In more detail, the thin layer heat-sticking-peeling method uses a heat sensitive ink sheet provided with a thin ink layer containing pigment in high content, and therefore the method is capable of giving a high quality color or monochrome image comprising mainly pigment which has multi-gradation by the area gradation. Thus, the image forming method is greatly improved in the above problems of the heat transfer recording method, and advantageously utilized for preparation of color proof in the printing field and block copy. Further, the pigments contained in the ink sheet have good durability and therefore the ink sheet is also useful for preparation of elements employed in the fields of the recordable or recorded card and outdoor or meter display.

As a transfer image forming method using the heat sensitive ink sheet, recently a method using a laser beam (i.e., digital image forming method) has been developed. The method comprises the steps of: superposing the heat sensitive ink layer of the heat sensitive ink sheet on an image receiving sheet, and applying a laser beam modulated by digital signal onto the heat sensitive ink layer through the support of the heat sensitive ink sheet to form and transfer an image of the heat sensitive ink layer onto the image receiving sheet (the image can be further retransferred onto other sheet). In the method, the heat sensitive ink sheet generally has a light-heat conversion layer provided between the ink layer and the support to efficiently convert light energy of laser beam into heat energy. The light-heat conversion layer is a thin layer made of carbon black or metal. Further, a method for locally peeling the ink layer to transfer the peeled ink layer onto the image receiving sheet (i.e., ablation method), which does not fuse the layer in the transferring procedure, is disclosed in Japanese Patent Provisional Publication No. 6(1994)-219052. The method is utilized in order to enhance image quality such as evenness of reflection density of the image or sharpness in edges of the image.

The image receiving sheet (materials to be transferred) in the transfer image forming method, usually has a structure wherein an adhesive layer (image receiving layer) containing an organic polymer is provided on a support, in order to prevent occurrence of uneven transfer and transferring error of dot which are originated from evenness or ink-receivable properties of the surface of the image receiving layer (U.S. Pat. Nos. 4,482,625, 4,766,053 and 4,933,258). As materials for the image receiving sheet, a paper, a synthetic paper and polymer film(s) are usually employed. Especially, polyethylene terephthalate film is advantageously employed due to excellent heat resistance property, even surface and low cost.

The image receiving layer of the image receiving sheet further contains a plasticizer such as ester of phthalic acid, ester of aromatic tri- or tetra- carboxylic acid, or polyester having a molecular weight of 3,300 or 8,000, in order to enhance heat sensitivity and density of transferred image or improve transferring or retaining property of an image formed on the heat sensitive ink sheet (Japanese Patent Provisional Publications No. 61(1986)-274990, No. 2(1990)-80291 and 4(1992)-310794). The image receiving layer containing the plasticizer, however, does not show satisfactory sensitivity, and the sensitivity tends to easily vary depending upon variation of the environmental conditions (e.g., temperature, humidity) in a procedure transferring an image formed on the ink sheet onto the image receiving sheet, which results in fluctuation of dot size of the resultant image or occurrence of fog in a non-image area.

SUMMARY OF THE INVENTION

The present inventor has further studied to obtain an image receiving sheet giving, in high sensitivity, a good image almost free from fluctuation of dot size of the image or occurrence of fog in a non-image area even under variation of the environmental conditions in the image transferring procedure. As a result, he has found that the image receiving sheet giving a good image almost free from the problems can be obtained by incorporating a specific plasticizer having at least one ester bond and molecular weight of 700 to 3,000 into the image receiving layer or an intermediate layer provided under the image receiving layer. Why the use of the specific plasticizer brings about the above effect is considered as follows: The incorporation of the specific plasticizer into image receiving layer or the intermediate layer gives appropriate cushion property to each layer, whereby, in the procedure superposing the ink sheet on the image receiving sheet, the ink layer having a formed image is in close contact with the image receiving layer such that the formed image can be precisely transferred onto the image receiving layer.

An object of the present invention is to provide an image receiving sheet which is capable of giving, in high sensitivity, a good image having high density almost free from fluctuation of dot size of the image or occurrence of fog in a non-image area, even under the variable environmental conditions in an image transferring procedure.

Another object of the invention is to provide an image forming method which is capable of giving, in high sensitivity, a good image having high density almost free from fluctuation of dot size of the image or occurrence of fog in a non-image area even under the variable environmental conditions in an image transferring procedure, and which is capable of forming a transferred image by multi-gradation.

A further object of the invention is to provide an image forming method using a laser beam which is capable of giving, in high sensitivity, a good image having high density almost free from fluctuation of dot size of the image or occurrence of fog in a non-image area even under the variable environmental conditions in an image transferring procedure.

Another object of the invention is to provide a composite of a heat sensitive ink sheet and an image receiving sheet which is suitable for the above image forming methods.

There is provided by the present invention an image receiving sheet comprising a support sheet, an intermediate layer thereon and an image receiving layer provided on the intermediate layer, wherein the intermediate layer comprises a polymer and a plasticizer having at least one ester bond and a weight-average molecular weight of 700 to 3,000.

In the invention, the plasticizer is a compound which has function of giving plasticity to a layer comprising the polymer (e.g., an intermediate layer or image receiving layer comprising a polymer), and which is capable of lowering the glass transition temperature (Tg) of the polymer to a temperature of not more than room temperature (generally not more than 30° C., preferably in the range of 30° C. to −30° C.).

The preferred embodiments of the above-mentioned image receiving sheet are follows:

1) The image receiving sheet wherein the plasticizer is an oligomer having phthalic acid ester unit of the following chemical structure (1):

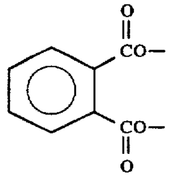

(1)

2) The image receiving sheet wherein the polymer is at least one polymer selected from the group consisting of polyvinyl chloride, vinyl chloride/vinyl acetate copolymer, vinyl chloride/vinyl alcohol copolymer and vinyl chloride/vinyl acetate/maleic acid copolymer.

3) The image receiving sheet wherein the polymer in the intermediate layer is in an amount of 50 to 95 weight % (preferably 60 to 90 weight %) and the plasticizer in the intermediate layer is in an amount of 5 to 50 weight % (preferably 10 to 40 weight %).

4) The image receiving sheet wherein the image receiving layer comprises at least one polymer selected from the group consisting of polyvinyl butyral, alkyl acrylate/acrylamide copolymer and alkyl acrylate/alkyl methacrylate/acrylamide copolymer (preferably polyvinyl butyral and alkyl acrylate/acrylamide copolymer).

5) The image receiving sheet wherein the intermediate layer has a thickness of 1 to 50 μm (preferably 5 to 30 μm).

6) The image receiving sheet wherein the image receiving layer has a thickness of 0.1 to 10 μm (preferably 0.5 to 5 μm).

There is also provided by the invention an image receiving sheet comprising a support sheet and an image receiving layer thereon, wherein the image receiving layer comprises a polymer and a plasticizer having at least one ester bond and a weight-average molecular weight of 700 to 3,000.

The preferred embodiments of the above-mentioned image receiving sheet are follows:

1) The image receiving sheet wherein the plasticizer is an oligomer having phthalic acid ester unit of the following chemical structure (1):

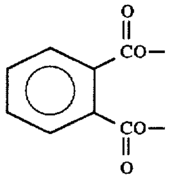

(1)

2) The image receiving sheet wherein the polymer is at least one polymer selected from the group consisting of polyvinyl butyral, alkyl acrylate/acrylamide copolymer and alkyl acrylate/alkyl methacrylate/acrylamide copolymer (preferably polyvinyl butyral and alkyl acrylate/acrylamide copolymer).

3) The image receiving sheet wherein the polymer in the image receiving layer is in an amount of 50 to 95 weight % (preferably 60 to 90 weight %) and the plasticizer in the image receiving layer is an amount of 5 to 50 weight % (preferably 10 to 40 weight %).

4) The image receiving sheet wherein the image receiving layer has a thickness of 0.2 to 30 μm (preferably 0.5 to 10 μm).

Further, there is provided by the invention an image forming method which comprises the steps of:

superposing the heat sensitive ink sheet comprising a base sheet and a heat sensitive ink layer thereon formed of heat sensitive ink material on the image receiving layer of one of the image receiving sheets of the invention described above (preferably the image receiving sheet comprising the support sheet, the intermediate layer and the image receiving layer);

placing imagewise a thermal head on the base sheet of the heat sensitive ink sheet to form an image of the ink material with area gradation on the image receiving sheet; and separating the base sheet of the heat sensitive ink sheet from the image receiving sheet so that the image of the ink material is retained on the image receiving layer.

The preferred embodiment of the above-mentioned image forming method are follow:

1) The image forming method wherein said heat sensitive ink layer of the heat sensitive ink sheet having a thickness of 0.2 to 1.5 μm and being formed of a heat sensitive ink material comprising 30 to 70 weight % of colored pigment and 25 to 65 weight % of amorphous organic polymer having a softening point of 40° to 150° C.

The following composite can be advantageously employed in the above image forming method using a thermal head.

A composite in which comprises the image receiving sheet of the invention described above comprising the support sheet, the intermediate layer and the image receiving layer and a heat sensitive ink sheet comprising a base sheet and a heat sensitive ink layer thereon which are superposed in such a manner that the heat sensitive ink layer is in contact with the image receiving layer, said heat sensitive ink layer of the heat sensitive ink sheet having a thickness of 0.2 to 1.5 μm and being formed of a heat sensitive ink material comprising 30 to 70 weight % of colored pigment and 25 to 65 weight % of amorphous organic polymer having a softening point of 40° to 150° C.

Furthermore, there is provided by the invention an image forming method which comprises the steps of:

superposing the heat sensitive ink sheet comprising a base sheet, a light-heat conversion layer thereon and a heat sensitive ink layer provided on the light-heat conversion layer which is formed of heat sensitive ink material, on the image receiving layer of one of the image receiving sheets of the invention described above;

irradiating a laser beam modulated by digital signals on the heat sensitive ink layer through the base sheet of the heat sensitive ink sheet to form an image of the ink material on the image receiving layer; and separating the base sheet of the heat sensitive ink sheet from the image receiving sheet so that the image of the ink material can be retained on the image receiving layer.

The preferred embodiments of the above-mentioned image forming method are follows:

1) The image forming method wherein said heat sensitive ink layer of the heat sensitive ink sheet having a thickness of 0.2 to 1.5 μm and being formed of a heat sensitive ink material comprising 30 to 70 weight % of colored pigment and 25 to 65 weight % of amorphous organic polymer having a softening point of 40° to 150° C.

2) The image forming method wherein the formation of the image of the ink material on the image receiving sheet is done through ablation of the image from the base sheet of the heat sensitive ink sheet.

The following composite can be advantageously employed in the above image forming method using a laser beam.

A composite which comprises one of the image receiving sheets of the invention described above and a heat sensitive ink sheet comprising a base sheet, a light-heat conversion layer thereon and a heat sensitive ink layer provided on the light-heat conversion layer which is formed of heat sensitive ink material, which are superposed in such a manner that the heat sensitive ink layer is in contact with the image receiving layer, said heat sensitive ink layer of the heat sensitive ink sheet having a thickness of 0.2 to 1.5 μm and being formed of a heat sensitive ink material comprising 30 to 70 weight % of colored pigment and 25 to 65 weight % of amorphous organic polymer having a softening point of 40° to 150° C.

The method of the invention can be utilized advantageously in preparation of a color proof of full color type.

In more detail, the preparation of a color proof can be performed by the steps of:

superposing a first heat sensitive ink sheet (such as a cyan ink sheet) on an image receiving sheet;

placing imagewise a thermal head on the back (base sheet) of the first heat sensitive ink sheet to form and transfer a color image (cyan image) of the heat sensitive ink material onto the image receiving sheet;

separating the ink sheet from the image receiving sheet so that the color image (cyan image) of the heat sensitive ink material is retained on the image receiving sheet;

superposing a second heat sensitive ink sheet (such as a magenta ink sheet) on the image receiving sheet having the cyan image thereon;

placing imagewise a thermal head on the back of the second heat sensitive ink sheet to form and transfer a color image (magenta image) of the heat sensitive ink material onto the image receiving sheet;

separating the ink sheet from the image receiving sheet so that the color image (magenta image) of the heat sensitive ink material is retained on the image receiving sheet;

superposing a third heat sensitive ink sheet (such as a yellow ink sheet) on the image receiving sheet having the cyan image and magenta image thereon;

placing imagewise a thermal head on the back of the second heat sensitive ink sheet to form and transfer a color image (yellow image) of the heat sensitive ink material onto the image receiving sheet;

separating the ink sheet from the image receiving sheet so that the color image (yellow image) of the heat sensitive ink material is retained on the image receiving sheet, whereby a multicolor image is formed on the image receiving sheet; and transferring thus prepared multicolor image onto a white paper sheet.

Use of the image receiving sheet containing the specific plasticizer in the image forming method, is capable of giving a good image almost free from fluctuation of dot size of the image or occurrence of fog in a non-image area even under variation of the environmental conditions in the image transferring procedure. In more detail, in the procedure superposing the ink sheet on the image receiving sheet, the ink layer having a formed image is in closely contact with the image receiving layer such that the formed image can be precisely transferred onto the image receiving layer. Therefore, use of the image receiving sheet is capable of giving, in high sensitivity, the good image.

Hence, the image receiving sheet of the invention can be advantageously utilized for preparing color proof.

In each figure, the axis of abscissas indicates particle size (μm), the left axis of ordinates indicates percentage (%) of particles of the indicated particle sizes, and the right axis of ordinates indicates accumulated percentage (%).

Figure 4:
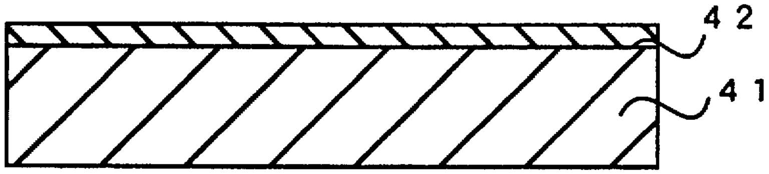

FIG. 4 shows a sectional view of a representative structure of the image receiving sheet of the invention.

Figure 5:
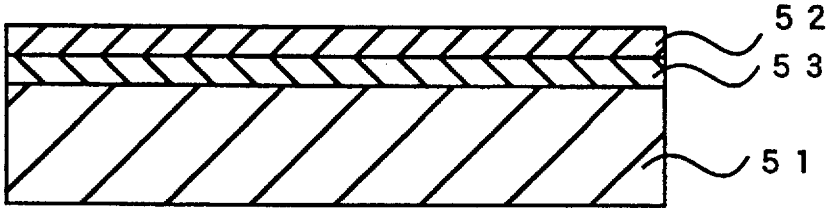

FIG. 5 shows a sectional view of another representative structure of the image receiving sheet of the invention.

Figure 6:
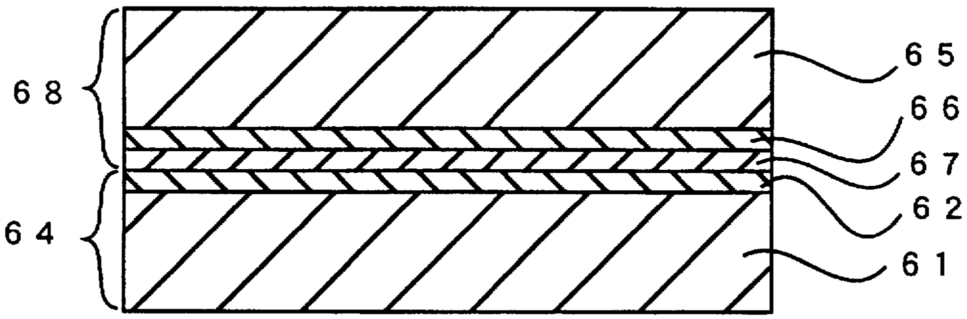

FIG. 6 shows a sectional view of a representative structure of the composite of the invention.

Figure 7:
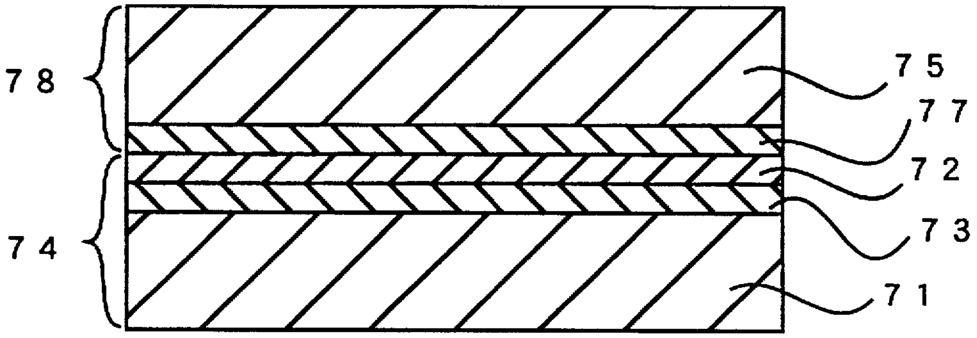

FIG. 7 shows a sectional view of another representative structure of the composite of the invention.

DETAILED DESCRIPTION OF THE INVENTION

The image forming method of the invention is utilized for thermal transfer recording by area gradation using a thermal head or laser beam. The image forming method is characterized in the use of the image receiving sheet having an image receiving layer or intermediate layer containing the specific plasticizer. The heat sensitive ink sheet employed in the image forming method generally has the heat sensitive ink layer formed of a heat sensitive ink material which comprises colored pigment and thermoplastic resin such as amorphous organic polymer.

The image receiving sheet of the invention is a sheet (1) comprising a support sheet (plastic support) and an image receiving layer (heat adhesive layer), or a sheet (2) sheet comprising a support sheet, an intermediate layer and an image receiving layer.

The structure of the image receiving sheet (1) is shown in FIG. 4. In FIG. 4, the image receiving layer 42 is provided on the support sheet 41 to constitute the image receiving sheet (1). The image receiving layer comprises a polymer and the specific plasticizer, and has cushion property.

The structure of the image receiving sheet (2) is shown in FIG. 5. In FIG. 5, the intermediate layer 53 is provided on the support sheet 51 and the image receiving layer 52 is provided on the intermediate layer 53, to constitute the image receiving sheet (2). The intermediate layer comprises a polymer and the specific plasticizer, and has cushion property.

The support sheet of the image receiving sheet is made of material having chemical stability and thermostability and flexibility. If desired, the support is required to have a large transmittance at a wavelength of the light source using for the exposure. Examples of materials of the support include polyesters such as polyethylene terephthalate (PET) and polyethylene naphthalate (PEN); polycarbonates; polyethersulfone; cellulose derivatives such as cellulose triacetate, nitrocellulose and cellophane; polyolefins such as polyethylene and polypropylene; polyvinyl chloride; polyvinylidene chloride; polyacrylates such as PMMA (polymethyl methacrylate), polyamides such as nylon and polyimide. Preferred are polyethylene terephthalate and polypropylene. Especially polyethylene terephthalate is preferred from the viewpoint of dimensional stability. The support preferably is biaxially stretched polyethylene terephthalate film. The thickness of the support is generally in the range of 5 to 300 μm, preferably in the range of 50 to 250 μm, especially in the range of 75 to 150 μm.

The support sheet preferably comprises a plastic sheet having fine pores therein (examples of materials of the plastic sheet generally are the same as above). The support sheet may be a porous sheet which is sandwiched between a backing layer and an anti-curling layer. The image receiving layer is not provided on the backing layer, but provided on the anti-curling layer.

A surface of the support sheet on which the image receiving layer is formed may be subjected to a coating treatment, or surface treatment such as corona discharge treatment or glow discharge treatment to enhance adhesion.

Further an undercoat layer may be formed on the surface of the support. The undercoat layer is not restricted so long as it increases adhesion between the support and the image receiving layer or intermediate layer. Preferred material for the undercoat layer is silane coupling agent.

Furthermore, the surface of the support may be subjected to antistatic treatment or matting treatment.

As described above, the image receiving sheet of the invention is a sheet (1) comprising the support sheet and the image receiving layer thereon, or a sheet (2) comprising the support sheet, the intermediate layer thereon and the image receiving layer provided on the intermediate layer. The image receiving layer of the sheet (1) and the intermediate layer of the sheet (2) each comprise a polymer and the specific plasticizer having at least one ester bond and a weight-average molecular weight of 700 to 3,000. The image receiving layer of the sheet (2) may contain the specific plasticizer. In the invention, the structure of the sheet (2) is preferred.

The intermediate layer of the sheet (2) is explained below.

Examples of polymer materials employed in the intermediate layer include polyolefins such as polyethylene and polypropylene; copolymers of ethylene and other monomer such as vinyl acetate or acrylic acid ester; polyvinyl chloride; copolymers of vinyl chloride and other monomer such as vinyl acetate, vinyl alcohol or maleic acid; polyvinylidene chloride; copolymer of vinylidene chloride and other monomer such as styrene; polyacrylate; polymethacrylate; polyamides such as copolymerized nylon and N-alkoxymethylated nylon; synthetic rubber; acrylic rubber; and chlorinated rubber. Preferred are polyvinyl chloride, copolymer of vinyl chloride and vinyl acetate, copolymer of vinyl chloride and vinyl alcohol and copolymer of vinyl chloride, vinyl acetate and maleic acid. The degree of polymerization preferably is in the range of 200 to 2,000.

The preferred polymer and copolymers are suitable for material of the intermediate layer due to the following reason:

(1) The polymer and copolymers show no tackiness at room temperature. (2) The polymer and copolymers have low Young's modulus (modulus of elasticity) and therefore are capable of easily following up unevenness of a transfer image in the heat transfer procedure. (3) Bonding strength to other layer or film can be easily controlled because the polymer and copolymer have a polar group such as hydroxyl or carboxyl. (4) Young's modulus can be easily controlled because the polymer and copolymer have a number of plasticizers showing good compatibility.

The plasticizer is a compound having at least one ester bond and a weight-average molecular weight of 700 to 3,000. The weight-average molecular weight preferably is in the range of 800 to 2,500 and especially in the range of 800 to 2,000.

Examples of the plasticizer include oligomer having adipate (adipic acid ester) unit (e.g., oligomer obtained by reaction or polymerization of adipic acid and polyhydric alcohol), oligomer having phthalate (phthalic acid ester) unit (e.g., oligomer obtained by reaction or polymerization of phthalic acid and polyhydric alcohol), and aromatic urethane acrylate (e.g., aromatic polyester urethane acrylate). Preferred is the oligomer having phthalate unit.

The phthalate unit generally has the following chemical structure:

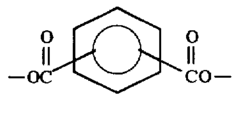

and preferably has the chemical structure (1):

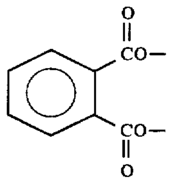

(1)

The adipate unit has the chemical structure (2):

$$-OOC-C_4H_8-COO \quad (2)$$

Examples of trade names of the plasticizer include Polycizer W-1000 (oligomer having adipate unit, weight-average molecular weight: 1,000, available from Dainippon Ink & Chemicals Inc.), Polycizer W-20 (oligomer having phthalate unit, weight-average molecular weight: 1,000, available from Dainippon Ink & Chemicals Inc.), EV-6600 (aromatic urethane acrylate, molecular weight: 1,598, available from Daicel Co., Ltd.) and DPCA-120 having the following structure (caprolactone-modified dipentaerythritol hexaacrylate, weight-average molecular weight: 1,947).

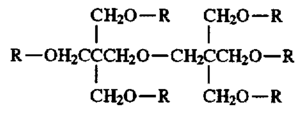

DPCA-120

$R = -\!\!\!+ CO(C_5H_{10})_2OCOCH=CH_2 -\!\!\!+$

The plasticizer is preferably contained in the intermediate layer in an amount of 5 to 50 weight %, especially in an amount of 10 to 40 weight %.

A thickness of the intermediate layer preferably is in the range of 1 to 50 μm, especially 5 to 30 μm. The thickness is determined by the following reasons: 1) the thickness should be larger than a depth of evenness of surface of the white paper sheet, 2) the thickness should be that capable of absorbing a thickness of the overlapped portion of a number of color images, 3) the thickness should be that capable of absorbing dust stuck onto the image receiving layer or the ink layer in the procedure of superposing the heat sensitive ink sheet and image receiving sheet, and 4) the thickness should have sufficient cushioning characteristics.

The intermediate layer generally has Young's modulus of not more than 200 kg.f/cm$^2$ at room temperature. Low Young's modulus gives cushioning characteristics to the intermediate layer, whereby transferring property is improved to give high recording sensitivity, good quality of dot and satisfactory reproducibility of gradation. Further, even if dust or dirt is present between the heat sensitive ink sheet and the image receiving sheet which are superposed for recording, the recorded image (transferred image) hardly has defect due to the cushioning characteristics of the intermediate layer. Furthermore, when the image transferred onto the image receiving sheet is retransferred onto a white paper sheet for printing by applying pressure and heat, the retransferring is conducted while the intermediate layer cushions variation of pressure depending upon unevenness of a surface of the paper sheet. Therefore, the image retransferred shows high bonding strength to the white paper sheet, and further an image (having the image receiving layer thereon) obtained by transferring an image which is formed on the receiving layer (described later) provided on the intermediate layer together with the receiving layer onto a white paper, shows a surface of a high gloss to give an image which is well analogous to a printed image.

Further, the intermediate layer may contain other various polymer, surface-active agent, surface lubricant or agent for improving adhesion, in order to control bonding strength between the intermediate layer and the support sheet or the image receiving layer. Furthermore, the intermediate layer preferably contain a tacky polymer (tackifier) in a small amount to reduce Young's modulus, so long as the layer has no tackiness.

For example, addition of fluorine-containing surface-active agent give improvement of dot shape by improving wetting property between the ink layer and the image receiving layer as well as reduction of the bonding strength between the layers. However, the excess addition reduces the bonding strength between the ink layer and the image receiving layer to give poor dot shape. Thus the surface-active agent or surface lubricant (e.g., fluorine-containing surface-active agent as above) is preferably added to the polymer material in an amount of 0.0001 to 5 weight %, especially in an amount of 0.001 to 3 weight %.

In the case that polyvinyl chloride or copolymer containing vinyl chloride unit is employed, an organic tin-type stabilizer such as dibutyltin compound or dioctyltin compound is preferably incorporated into the polymer or copolymer.

The image of the heat sensitive material is transferred on the image receiving layer of the image receiving sheet having the intermediate layer and image receiving layer, and further is generally retransferred onto the white paper sheet. In the procedure, the image is transferred on the white paper sheet together with the image receiving layer. Hence, a surface of the image on the white paper sheet has a gloss analogous to that of a printed image with subjecting to no surface treatment such as matting treatment, due to the image receiving layer provided on the image. Further, the image receiving layer improves scratch resistance of the retransferred image.

The image receiving layer, which is provided on the intermediate layer, preferably comprises a polymer although the layer can be made of various materials. Examples of these polymers include polyolefins such as polyethylene and polypropylene; copolymers of ethylene and other monomer such as vinyl acetate or acrylic acid ester; polyvinyl chloride; copolymers of vinyl chloride and other monomer such vinyl acetate, vinyl alcohol or maleic acid; copolymer of vinylidene chloride and other monomer such as styrene; polystyrene; copolymer of styrene and other monomer such as maleic acid ester; polyvinyl acetate; butyral resin; modified polyvinyl alcohol; copolymer of alkyl acrylate and acrylamide; copolymer of alkyl acrylate, alkyl methacrylate and acrylamide; polyamides such as copolymerized nylon and N-alkoxymethylated nylon; synthetic rubber; chlorinated rubber; phenol resin; epoxy resin; urethane resin; urea resin; melamine resin; alkyd resin; maleic acid resin; copolymer containing hydroxystyrene; sulfonamide resin; rosin ester; celluloses; and rosin. Preferred are butyral resin and copolymer of alkyl acrylate and acrylamide.

The image receiving layer can contain a surface-active agent, surface lubricant, plasticizer or agent for improving adhesion in order to control bonding strength between the image receiving layer and the intermediate layer or the heat sensitive ink layer. Further, it is preferred to employ a solvent not to dissolve or swell the resin contained in the intermediate layer as a solvent used in a coating liquid for forming the image receiving layer. For example, when polyvinyl chloride, which easily dissolves in various solvents, is used as a resin of the intermediate layer, a solvent used in the coating liquid of the image receiving layer preferably is alcohol or solvent mainly containing water.

A thickness of the image receiving layer preferably is in the range of 0.1 to 10 μm, especially 0.5 to 5.0 μm. The thickness exceeding 10 μm damages unevenness of the transferred image derived from an uneven surface of the white paper sheet (onto which the image on the image receiving sheet is retransferred) and therefore the transferred image is not near to a printed image due to its high gloss.

In order to control the bonding strength between the intermediate layer and image receiving layer, solvents contained in the coating solutions of the intermediate layer and image receiving layer are selected as mentioned above; further for example, the materials of the intermediate layer and image receiving layer are used in combination of hydrophilic polymer and liophilic polymer, in combination of polar polymer and nonpolar polymer, or surface-active agent, surface lubricant such as a fluorine-containing compound or silicone-containing compound, or agent for improving adhesion such as silane coupling agent are appropriately used as additives.

On the image receiving layer, a lubricating layer (overcoating layer) can be provided to improve lubricating property and scratch resistance of a surface of the image receiving layer.

Examples of materials forming the layer include a higher fatty acid (e.g., palmitic acid or stearic acid), a metal salt of a fatty acid (e.g., zinc stearate), a fatty acid derivative (e.g., fatty acid ester, its partial saponification product or fatty acid amide), a higher alcohol, a polyol derivative (e.g., ether of polyol), wax (e.g., paraffin wax, carnauba wax, montan wax, bees wax, Japan wax, or candelilla wax), cationic surfactant (e.g., ammonium salt having long aliphatic chain group or pyridinium salt), anionic and nonionic surfactants having a long aliphatic chain group, and perfluoro-type surfactant.

An optional layer can be provided between the intermediate layer and image receiving layer, in order to control transferring property.

The above explanation of the image receiving sheet corresponds to the case that cushion property is given to the intermediate layer of the image receiving sheet. Alternatively, an image receiving layer is directly formed on the support sheet to form the image receiving sheet shown in FIG. 4. In this case, the specific plasticizer is contained in the image receiving layer. The composition of the image receiving layer is basically the same as that of the image receiving layer of the sheet having the intermediate layer. In more detail, the image receiving layer preferably contains the polymer in an amount of 50 to 95 weight % (especially 60 to 90 weight %) and the plasticizer in an amount of 5 to 50 weight % (especially 10 to 40 weight %). The image receiving layer has a thickness of 0.2 to 30 μm, especially 0.5 to 10 μm.

The above structure of the image receiving sheet (FIG. 4) is especially useful in the image forming method using a laser beam.

The heat sensitive ink sheet has a base sheet and a heat sensitive ink layer which is formed of a heat sensitive ink material comprising colored pigment and thermoplastic resin. The heat sensitive ink sheet generally has a base sheet and a heat sensitive ink layer having a thickness of 0.2 to 1.5 μm which is formed of a heat sensitive ink material comprising 30 to 70 weight % of colored pigment and 25 to 65 weight % of amorphous organic polymer having a softening point of 40° to 150° C. The sheet can be advantageously employed in the image forming method using a thermal head or a laser beam.

The heat sensitive ink sheet can be particularly utilized in the formation of multigradation image (especially multicolor image) by area gradation (multi-valued recording), while the sheet can be naturally utilized in binary recording.

As the base sheet, any of the materials of the support sheet employed in the conventional fused ink transfer system and sublimation ink transfer system can be employed.

Preferably employed is a polyester film of approx. 5 μm thick which has been subjected to release treatment.

In the image forming method using a laser beam, the base sheet is generally made of materials through which light passes. Examples of the materials include polyethylene terephthalate (PET), polycarbonate, polyethylene, polyvinyl chloride, polyvinylidene chloride, polystyrene and styrene/acrylonitrile copolymer. Preferred are a polyethylene terephthalate and polypropylene. Especially, biaxially oriented polyethylene terephthalate is preferred from the viewpoint of mechanical strength and dimensional stability. The surface of the base sheet may be subjected to glow discharge or corona discharge treatment. The thickness of the base sheet generally is in the range of 10 to 200 μm, and preferably in the range of 20 to 150 μm.

Further, a undercoat layer may be formed on the surface of the base sheet, if desired. The undercoat layer are preferably formed of materials showing good adhesion and excellent heat resistance. Preferred is polystyrene having small heat conductivity in order to depress reduction of the sensitivity caused by heat conductive. The thickness the undercoat layer is generally in the range of 0.01 to 2 μm.

The colored pigment to be incorporated into the heat sensitive ink layer can be optionally selected from known pigments. Examples of the known pigments include carbon black, azo-type pigment, phthalocyanine-type pigment, qunacridone-type pigment, thioindigo-type pigment, anthraquinone-type pigment, and isoindolin-type pigment. These pigments can be employed in combination with each other. A known dye can be employed in combination with the pigment for controlling hue of the color image.

The heat transfer ink layer employed in the invention contains the pigment in an amount of 30 to 70 weight % and preferably in an amount of 30 to 50 weight %. When the amount of the pigment is not less than 30 weight %, it is difficult to form an ink layer of the thickness of 0.2 to 1.5 μm which shows a high reflection density. Moreover, the pigment preferably has such particle distribution that at least 70 weight % of the pigment particles has a particle size of not less than 1.5 μm. A pigment particle of large particle size reduces transparency of the formed image, particularly in the area in which a number of color images are overlapped. Further, large particles bring about difficulty to prepare the desired ink layer satisfying the relationship between the preferred thickness and reflection density.

Any of amorphous organic polymers having a softening point of 40° to 150° C. can be employed for the preparation of the ink layer of the heat sensitive ink sheet. A heat-sensitive ink layer using an amorphous organic polymer having a softening point of lower than 40° C. shows unfavorable adhesion, and a heat-sensitive ink layer using an amorphous organic polymer having a softening point of higher than 150° C. shows poor sensitivity. Examples of the amorphous organic polymers include butyral resin, polyamide resin, polyethyleneimine resin, sulfonamide resin, polyesterpolyol resin, petroleum resin, homopolymers and copolymers of styrene or its derivatives (e.g., styrene, vinyltoluene, α-methylstyrene, 2-methylstyrene, chlorostyrene, vinylbenzoic acid, sodium vinylbenzenesulfonate and aminostyrene), and homopolymers and copolymers of methacrylic acid or its ester (e.g., methacrylic acid, methyl methacrylate, ethyl methacrylate, butyl methacrylate, and hydroxyethyl methacrylate), homopolymers and copolymers of acrylic acid or its ester (e.g., acrylic acid, methyl acrylate, ethyl acrylate, butyl acrylate, and α-ethylhydroxy acrylate), homopolymers and copolymers of a diene compound (e.g., butadiene and isoprene), and homopolymers and copolymers of other vinyl monomers (e.g., acrylonitrile, vinyl ether, maleic acid, maleic acid ester, maleic anhydride, cinnamic acid, vinyl chloride, and vinyl acetate). Further, there can be mentioned copolymers of at least two monomers selected from acrylic acid, its ester, methacrylic acid, its ester, a diene compound and other vinyl monomers, which are described above. These resins and polymers can be employed in combination.

Particularly preferred are butyral resin and styrene/maleic acid half ester resin, from the viewpoint of good dispersibility of the pigment.

Examples of trade names of the butyral resin include Denka butyral #2000-L (softening point: 57° C. (measured by DSC (Differential Scanning Calorimeter); degree of polymerization: approx. 300) and Denka butyral #4000-1 (softening point: 57° C.; degree of polymerization: approx. 920) which are available from Denki Kagaku Kogyo Co., Ltd.; and Eslec BX-10 (softening point: 72° C.; Tg: 74° C.; degree of polymerization: 80; acetyl value: 69 molar %) and Eslec BL-S (Tg: 61° C., viscosity: 12 cps in 5 weight % ethanol/toluene [1/1 by weight] solution) which are available from Sekisui Chemical Co., Ltd.

The ink layer of the heat sensitive ink sheet contains the amorphous organic polymer having a softening point of 40° to 150° C. in an amount of 25 to 65 weight % (30 to 70 weight % in the method using laser beam), and preferably in an amount of 30 to 50 weight %.

In the invention, it is preferred that both of the heat sensitive ink layer and the second image receiving layer contain the same polymer or the same kind polymer each other.

The heat sensitive ink layer preferably contains a nitrogen-containing compound. The nitrogen-containing compound preferably is an amide compound having the formula (I), an amine compound, a quaternary ammonium salt, hydarazine, aromatic amine or a heterocyclic compound. Preferred is an amide compound having the formula (I).

The amide compound having the formula (I) is explained.

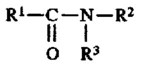 (I)

in which $R^1$ represents an alkyl group of 8 to 24 carbon atoms, an alkoxyalkyl group of 8 to 24 carbon atoms, an alkyl group of 8 to 24 carbon atoms having a hydroxyl group, or an alkoxyalkyl group of 8 to 24 carbon atoms having a hydroxyl group, and each of $R^2$ and $R^3$ independently represents a hydrogen atom, an alkyl group of 1 to 12 carbon atoms, an alkoxyalkyl of 1 to 12 carbon atoms, an alkyl group of 1 to 12 carbon atoms having a hydroxyl group, or an alkoxyalkyl group of 1 to 12 carbon atoms having a hydroxyl group, provided that $R^1$ is not the alkyl group in the case that $R^2$ and $R^3$ both represent a hydrogen atom.

In the formula (I), $R^1$ generally is an alkyl group of 8 to 18 carbon atoms, an alkoxyalkyl group of 8 to 18 carbon atoms, an alkyl group of 8 to 18 carbon atoms having a hydroxyl group, or an alkoxyalkyl group of 8 to 18 carbon atoms having a hydroxyl group. $R^1$ preferably is an alkyl group of 8 to 18 carbon atoms (especially 12 to 18 carbon atoms) or an alkyl group of 8 to 18 carbon atoms (especially 12 to 18 carbon atoms) having a hydroxyl group.

$R^2$ generally represents a hydrogen atom, an alkyl group of 1 to 10 carbon atoms (especially 1 to 8 carbon atoms), an alkoxyalkyl group of 1 to 10 carbon atoms (especially 1 to 8 carbon atoms), an alkyl group of 1 to 10 carbon atoms having a hydroxyl group (especially 1 to 8 carbon atoms), or an alkoxyalkyl group of 1 to 10 carbon atoms having a hydroxyl group (especially 1 to 8 carbon atoms). $R^2$ preferably is an alkyl group of 1 to 10 carbon atom (especially 1 to 8 carbon atoms) or an alkyl group of 1 to 10 carbon atom (especially 1 to 8 carbon atoms) having a hydroxyl group.

$R^3$ preferably is a hydrogen atom, an alkyl group of 1 to 4 carbon atom (especially 1 to 3 carbon atoms). Especially, $R^3$ preferably is a hydrogen atom. Examples of the alkyl groups include methyl, ethyl, isopropyl, n-propyl, n-butyl, isobutyl and tert-butyl.

However, $R^1$ is not the alkyl group (i.e., $R^1$ is the alkoxyalkyl, the alkyl group having a hydroxyl group or the alkoxyalkyl having a hydroxyl group), in the case that $R^2$ and $R^3$ both represent a hydrogen atom.

The heat sensitive ink layer generally contains 0.1 to 20 weight % of the nitrogen-containing compound, and especially 1 to 10 weight % of the compound. The compound preferably exists in the heat sensitive ink sheet in the amount of 0.01 to 2 g per 1 $m^2$, especially 0.01 to 5 g per 1 $m^2$.

The ink layer can further contain 0.1 to 20 weight % of additives such as a releasing agent and/or a softening agent based on the total amount of the ink layer so as to facilitate release of the ink layer from the support when the thermal printing (image forming) takes place and increase heat-sensitivity of the ink layer. Examples of the additives include a higher fatty acid (e.g., palmitic acid and stearic acid), a metal salt of a fatty acid (e.g., zinc stearate), a fatty acid derivative (e.g., fatty acid ester and its partial saponification product), a higher alcohol, a polyol derivative (e.g., ether of polyol), wax (e.g., paraffin wax, carnauba wax, montan wax, bees wax, Japan wax, and candelilla wax), low molecular weight polyolefin (e.g., polyethylene, polypropylene, and polybutyrene) having a viscosity mean molecular weight of approx. 1,000 to 10,000, low molecular weight copolymer of olefin (specifically α-olefin) with an organic acid (e.g., maleic anhydride, acrylic acid, and methacrylic acid) or vinyl acetate, low molecular weight oxidized polyolefin, halogenated polyolefin, homopolymer of acrylate or methacrylate (e.g., methacylate having a long alkyl chain such as lauryl methacrylate and stearyl methacrylate, and acrylate having a perfluoro group), copolymer of acrylate or methacrylate with vinyl monomer (e.g., styrene), low molecular weight silicone resin and silicone modified organic material (e.g., polydimethylsiloxane and polydiphenylsiloxane), cationic surfactant (e.g., ammonium salt having a long aliphatic chain group and pyridinium salt), anionic and nonionic surfactants having a long aliphatic chain group, and perfluoro-type surfactant.

The compounds are employed singly or in combination with two or more kinds.

The pigment can be appropriately dispersed in the amorphous organic polymer by conventional methods known in the art of paint material such as that using a suitable solvent and a ball mill. The nitrogen-containing compound and/or the additives can be added into the obtained dispersion to prepare a coating liquid. The coating liquid can be coated on the base sheet according to a conventional coating method known in the art of paint material to form the heat-sensitive ink layer.

The thickness of the ink layer generally is in the range of 0.2 to 1.5 µm, preferably in the range of 0.2 to 1.0 µm, an d especially in the range of 0.2 to 0.6 µm. An excessively thick ink layer having a thickness of more than 1.5 µm gives an image of poor gradation on the shadow portion and highlight portion in the reproduction of image by area gradation. A very thin ink layer having a thickness less than 0.2 µm cannot form an image of acceptable optical reflection density.

The heat-sensitive ink layer employed in the invention mainly comprises a pigment and an amorphous organic polymer, and the amount of the pigment in the layer is high, as compared with the amount of the pigment in the conventional ink layer using a wax binder. Therefore, the ink layer of the invention shows a viscosity of higher than $10^4$ cps at 150° C. (the highest thermal transfer temperature), while the conventional ink layer shows a viscosity of $10^2$ to $10^3$ cps at the same temperature. Accordingly, when the ink layer of the invention is heated, the ink layer per se is easily peeled from the support and transferred onto an image receiving layer keeping the predetermined reflection density. Such peeling type transfer of the extremely thin ink layer enables to give an image having a high resolution, a wide gradation from a shadow potion to a highlight portion, and satisfactory edge sharpness. Further, the complete transfer (100%) of image onto the image receiving sheet gives desired uniform reflection density even in a small area such as characters of 4 point and a large area such as a solid portion.

The composite of the invention comprises the image receiving sheet comprising the support sheet and the image receiving layer and the heat sensitive ink sheet (preferably comprising the base sheet, a light-heat conversion layer and a heat sensitive ink layer). The composite is advantageously employed in the following image forming methods (especially method using a laser beam). The structure of the composite is shown in FIG. 6.

The light-heat conversion layer 66 is provided on the base sheet 65, and the heat sensitive ink layer 67 is further provided on the light-heat conversion layer 66, to constitute the ink sheet 68. The heat sensitive ink sheet 68 is superposed on the image receiving sheet 64 comprising the support sheet 61 and the image receiving layer 62, such a manner that the heat sensitive ink layer 67 is in contact with the image receiving layer 62, to constitute the composite. The image receiving sheet 64 may have the intermediate layer.

The composite of the invention comprises the image receiving sheet comprising the support sheet, the intermediate layer and the image receiving layer and the heat sensitive ink sheet (preferably comprising the base sheet and a heat sensitive ink layer). The composite is advantageously employed in the following image forming methods (especially method using a thermal head). The structure of the composite is shown in FIG. 7.

The heat sensitive ink layer 77 is provided on the base sheet 75 to constitute the ink sheet 78. The heat sensitive ink sheet 78 is superposed on the image receiving sheet 74 which comprises the support sheet 71, the intermediate layer 73 thereon and the image receiving layer 72 provided on the intermediate layer 73, such a manner that the heat sensitive ink layer 77 is in contact with the image receiving layer 72, to constitute the composite.

Subsequently, the image forming method of the invention is described below.

The image forming method (thermal transfer recording) of the invention can be, for example, performed by means of a thermal head (generally using as thermal head printer) using the above heat sensitive ink sheet and the above image receiving sheet.

The method utilizing the thermal head can be conducted by the steps of: superposing the heat sensitive ink sheet having the heat sensitive ink layer on the image receiving sheet (formation of composite of the invention); placing imagewise a thermal head the back (the base sheet) of the heat sensitive ink sheet to form and transfer an image of the heat sensitive ink material of the ink layer onto the image receiving sheet (i.e., the image receiving layer) by separating the ink sheet from the image receiving sheet. The formation of the image using the thermal head is generally carried out utilizing area gradation. The transferred image onto the image receiving layer has an optical reflection density of at least 1.0.

For conducting the formation of the image, the heat sensitive ink sheet is laminated on the image receiving sheet using a laminator in such a manner that the heat sensitive ink layer is in contact with the image receiving layer to prepare a composite, and this composite can be employed.

Subsequently, the following procedures can be performed. After a white paper sheet is prepared, the image receiving sheet having the transferred image is superposed on the white paper sheet, which generally is a support for printing, in such a manner that the transferred image is in contact with a surface of the white paper sheet, and the composite is subjected to pressing and heating treatments, and the image receiving sheet (having the first image receiving layer) is removed from the composite whereby the retransferred image can be formed on the white paper sheet (together with the second image receiving layer). The transferred image onto the white paper sheet has an optical reflection density of at least 1.0.

The above formation of the image can be generally conducted using the thermal head printer by means of area gradation.

Further, the method similar to the above-mentioned image forming method can be conducted using a laser beam instead of the thermal head. The image forming method (thermal transfer recording method) utilizing the a laser beam can utilize methods (i.e., ablation method) described in U.S. Pat. No. 5,352,562 and Japanese Patent Provisional Publication No. 6(1994)-219052. The method of Japanese Patent Provisional Publication No. 6(1994)-219052 is performed by the steps of: superposing a heat sensitive ink sheet comprising a base sheet and a heat sensitive ink layer (image forming layer) between which a light-heat conversion layer capable of converting an absorbed laser beam into heat energy and a heat sensitive peeling layer containing heat sensitive material capable of producing a gas by absorbing the heat energy (or only a light-heat conversion layer further containing the heat sensitive material) are provided on the image receiving sheet in such a manner that the heat sensitive ink layer is in contact with a surface of the image receiving sheet; irradiating imagewise a laser beam on the composite (the heat sensitive ink sheet and the image receiving sheet) to enhance temperature of the light-heat conversion layer; causing ablation by decomposition or melting of materials of the light-heat conversion layer and decomposing a portion of the heat sensitive peeling layer to produce a gas, whereby bonding strength between the heat sensitive ink layer and the light-heat conversion layer reduces; and transferring the heat sensitive ink layer corresponding to the portion onto the image receiving layer.

The above image forming method is usually conducted using a laser recording machine. First, the side (support sheet) having no image receiving layer of the image receiving sheet is closely placed and fixed on a laser recording drum by the means of suction, etc. (e.g., fixed on the drum by sucking inside of the drum). Then, the ink layer of the heat-sensitive ink sheet is placed on the image receiving layer of the image receiving sheet, passed through a couple of rollers under pressure (if desired under heating), whereby the heat-sensitive ink sheet and the image receiving sheet are united to prepare a composite. The composite can be beforehand prepared with using no laser recording drum by superposing the heat-sensitive ink sheet on the image receiving sheet in such a manner that the ink layer is in contact with the image receiving layer and passing them under pressure (if desired under heating) through a couple of rollers, and the composite can be also employed in the later procedure.

The pressure for preparing the composite is generally in the range of 1 to 30 $kg/cm^2$, preferably in the range of 2 to 10 $kg/cm^2$. The procedure of passing the sheets under pressure through a couple of rollers is preferably conducted under heating. The heating is conducted in such a manner that the surfaces of the rollers are preferably heated at a temperature of not higher than 250° C., especially at a temperature of 60° to 150° C. The support sheet of the image receiving sheet is made of plastic sheet having fine pores therein, and therefore the pressing procedure can be conducted under even pressure due to cushion property and flexibility of the support sheet to form a composite in which the heat sensitive ink sheet is closely superposed on the image receiving sheet. When dust is stuck onto the image receiving layer or the ink layer in the procedure of superposing the heat sensitive ink sheet and image receiving sheet, the image receiving layer or intermediate layer almost cushions deformation by dust to reduce image defect.

Subsequently, a laser beam modulated by color separated image signals scans the heat sensitive ink sheet of the composite on the recording drum with rotating the drum, to record the signals. Then, the heat sensitive ink sheet is peeled from the image receiving sheet to form a transferred image on the image receiving sheet. The resultant image generally has area gradation of an optical reflection density of at least 1.0.

Otherwise, in the above method using a laser beam, formation of the image can be also conducted by the steps of portionwise melting the heat sensitive ink layer by means of heat energy given by absorption of a laser beam, and transferring the portion onto the image receiving sheet under melting.

Further, the resultant transferred image formed on the image receiving sheet is superposed on a white paper sheet (printing paper) which is separately prepared, and the composite is pressed under heating to form a retransferred image on the white paper sheet. The resultant image generally has area gradation of an optical reflection density of at least 1.0.

In the above method using a laser beam (utilizing the ablation), a light-heat conversion layer is provided between the base sheet and the heat sensitive ink layer. Further, a heat sensitive peeling layer is generally provided on the light-heat conversion layer in order to advantageously conduct the ablation method. When the light-heat conversion layer combines light-heat conversion function with heat sensitive peeling function, the heat sensitive peeling layer may be not necessarily provided.

The light-heat conversion layer and heat sensitive peeling layer mentioned above are explained below.

The light-heat conversion layer basically comprises a coloring material (e.g., dye or pigment) and a binder.

Examples of the coloring material include black pigments such as carbon black, pigments of large cyclic compounds such as phthalocyanine and naphthalocyanine absorbing a light having wavelength from visual region to infrared region, organic dyes such as cyanine dyes (e.g., indolenine compound), anthraquinone dyes, azulene dyes and phthalocyanine dyes which are employed as laser absorbing materials of high-density laser recording media such as an optical disc, and dyes of organic metal compounds such as dithiol nickel complex. The light-heat conversion layer preferably is as thin as possible to enhance recording sensitivity, and therefore dyes such as cyanine, phthalocyanine and naphthalocyanine having a large absorption coefficient are preferably employed.

Examples of the binder include homopolymer or copolymer of acrylic monomers such as acrylic acid, methacrylic acid, acrylic acid ester and methacrylic acid ester; celluloses such as methyl cellulose, ethyl cellulose and cellulose acetate; vinyl polymers such as polystyrene, vinyl chloride/vinyl acetate copolymer, polyvinyl pyrrolidone, polyvinyl butyral and polyvinyl alcohol; copolymer of vinyl monomers; polycondensation polymers such as polyester and polyamide; and thermoplastic polymers containing rubber (e.g., butadiene/styrene copolymer). Otherwise, the binder may be a resin formed by polymerization or cross-linkage of monomers such as epoxy compounds by means of light or heating.

A ratio between the amount of the coloring material and that of the binder preferably is in the range of 1:5 to 10:1 (coloring material:binder), especially in the range of 1:3 to 3:1. When the amount of the binder is less than the lower limit, cohesive force of the light-heat conversion layer lowers and therefore the layer is apt to transfer onto the image receiving sheet together with the heat sensitive ink layer in the transferring procedure. Further, the light-heat conversion layer containing excess binder needs a large thickness to show a desired light absorption, which occasionally results in reduction of sensitivity.

The thickness of the light-heat conversion layer generally is in the range of 0.05 to 2 μm, and preferably 0.1 to 1 μm. The light-heat conversion layer preferably shows light absorption of not less than 70% in a wavelength of a used laser beam.

The heat sensitive peeling layer is a layer containing a heat sensitive material. Examples of the material include a compound (e.g., polymer or low-molecular weight compound) which is itself decomposed or changed by means of heating to produce a gas; and a compound (e.g., polymer or low-molecular weight compound) in which a relatively volatile liquid such as water has been adsorbed or absorbed in marked amount. These compounds can be employed singly or in combination of two kinds.

Examples of the polymers which are itself decomposed or changed by means of heating to produce a gas include self-oxidizing polymers such as nitrocellulose; polymers containing halogen atom such as chlorinated polyolefin, chlorinated rubber, polyvinyl chloride and polyvinylidene chloride; acrylic polymers such as polyisobutyl methacylate in which relatively volatile liquid such as water has been adsorbed; cellulose esters such as ethyl cellulose in which relatively volatile liquid such as water has been adsorbed; and natural polymers such as gelatin in which relatively volatile liquid such as water has been adsorbed.

Examples of the low-molecular weight compounds which are itself decomposed or changed by means of heating to produce a gas include diazo compounds and azide compounds.

These compounds which are itself decomposed or changed preferably produce a gas at a temperature not higher than 280° C., especially produce a gas at a temperature not higher than 230° C. (preferably a temperature not lower than 100° C.).

In the case that the low-molecular weight compound is employed as the heat sensitive material of the heat sensitive peeling layer, the compound is preferably employed together with the binder. The binder may be the polymer which itself decomposes or is changed to produce a gas or a conventional polymer having no property mentioned above. A ratio between the low-molecular weight compound and the binder preferably is in the range of 0.02:1 to 3:1 by weight, especially 0.05:1 to 2:1.

The heat sensitive peeling layer is preferably formed on the whole surface of the light-heat conversion layer.

The thickness preferably is in the range of 0.03 to 1 μm, especially 0.05 to 0.5 μm.

The present invention is further described by the following Examples and Comparison Examples. The term "part(s)" indicated in Example means "weight part(s)".

EXAMPLE 1

(1) Preparation of image receiving sheet

The following coating liquids for intermediate layer and image receiving layer were prepared:

| (Coating liquid for intermediate layer) | |
|---|---|
| Vinyl chloride/vinyl acetate copolymer (MPR-TSL, available from Nisshin Kagaku Co., Ltd.) | 25.0 parts |
| Oligomer having phthalate unit (Polycizer-W-20, weight-average molecular weight: 1,000, available from Dainippon Ink & Chemicals Inc.) | 12.0 parts |
| Surface active agent (Megafack F-177, available from Dainippon Ink & Chemicals Inc.) | 4.0 parts |
| Solvent (Methyl ethyl ketone) | 75.0 parts |

| (Coating liquid for image receiving layer) | |
|---|---|
| Butyral resin (Denka Butyral #2000-L, available from Denki Kagaku Kogyo K.K.) | 16.0 parts |
| N,N-dimethylacrylamide/butyl acrylate copolymer | 4.3 parts |
| Surface active agent (Megafack F-177, available from Dainippon Ink & Chemicals Inc.) | 0.5 part |
| Solvent (n-propyl alcohol) | 200.0 parts |

The above coating liquid for intermediate layer was coated on a polyester film (support sheet) having fine pores therein (thickness: 100 μm) using a whirler, and dried for 2 minutes in an oven of 100° C. to form a intermediate layer (thickness: 20 μm) on the film.

Subsequently, the above coating liquid for image receiving layer was coated on the intermediate layer using a whirler, and dried for 2 minutes in an oven of 100° C. to form a image receiving layer (thickness: 2 μm).

(2) Preparation of heat sensitive ink sheet

The following three pigment dispersions were prepared:

| | | |
|---|---|---|
| A) | Cyan pigment dispersion | |
| | Cyan Pigment (CI, P.B. 15:4) | 12.0 parts |
| | Binder solution | 122.8 parts |
| B) | Magenta pigment dispersion | |
| | Magenta Pigment (CI, P.R. 57:1) | 12.0 parts |
| | Binder solution | 122.8 parts |

-continued

| | | |
|---|---|---|
| C) | Yellow pigment dispersion | |
| | Yellow Pigment (CI, P.Y. 14) | 12.0 parts |
| | Binder solution | 122.8 parts |

The binder solution comprised the following components:

| | |
|---|---|
| Butyral resin (softening point: 57° C., Denka Butyral #2000-L, available from Denki Kagaku Kogyo K.K.) | 12.0 parts |
| Solvent (n-propyl alcohol) | 110.0 parts |
| Dispersing agent (Solsparese S-20000, available from ICI Japan Co., Ltd.) | 0.8 parts |

Figure 1:
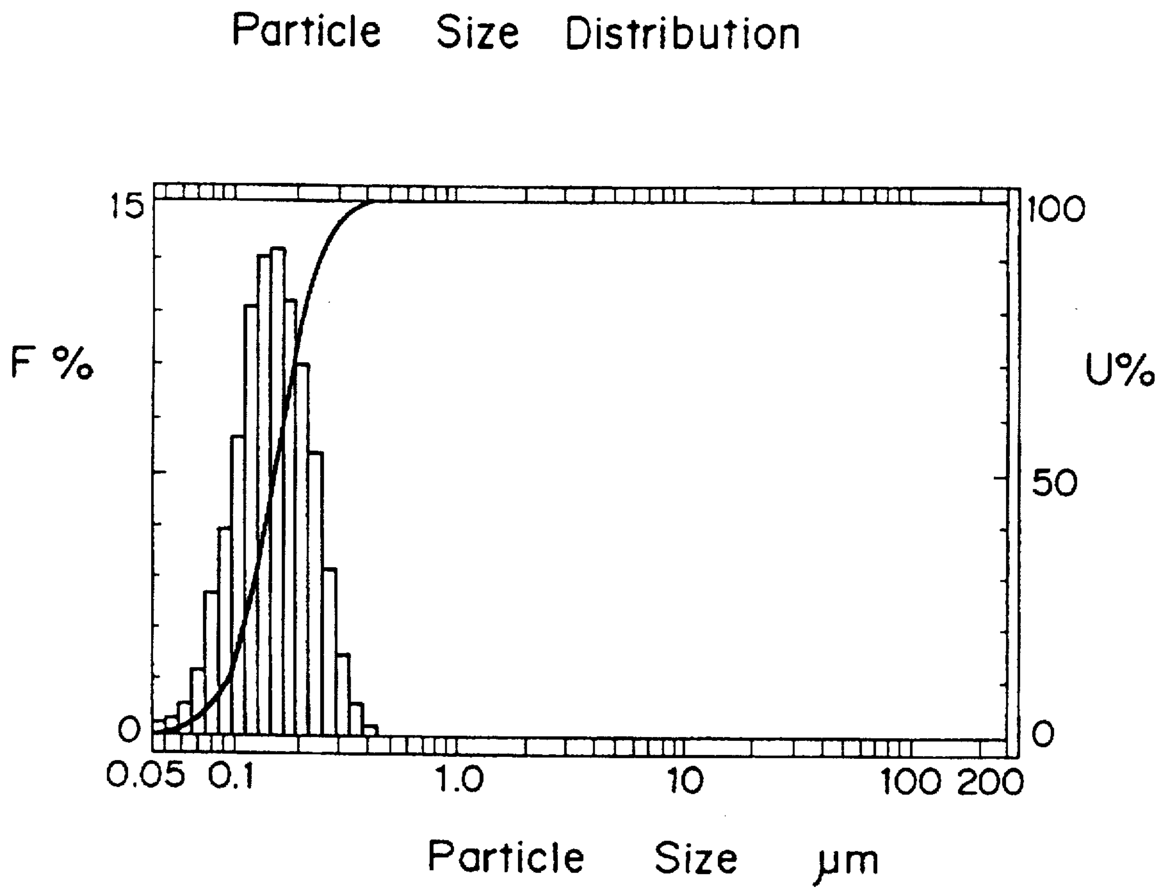
FIG. 1 shows a particle size distribution of cyan pigment employed in Example 1.
Figure 2:
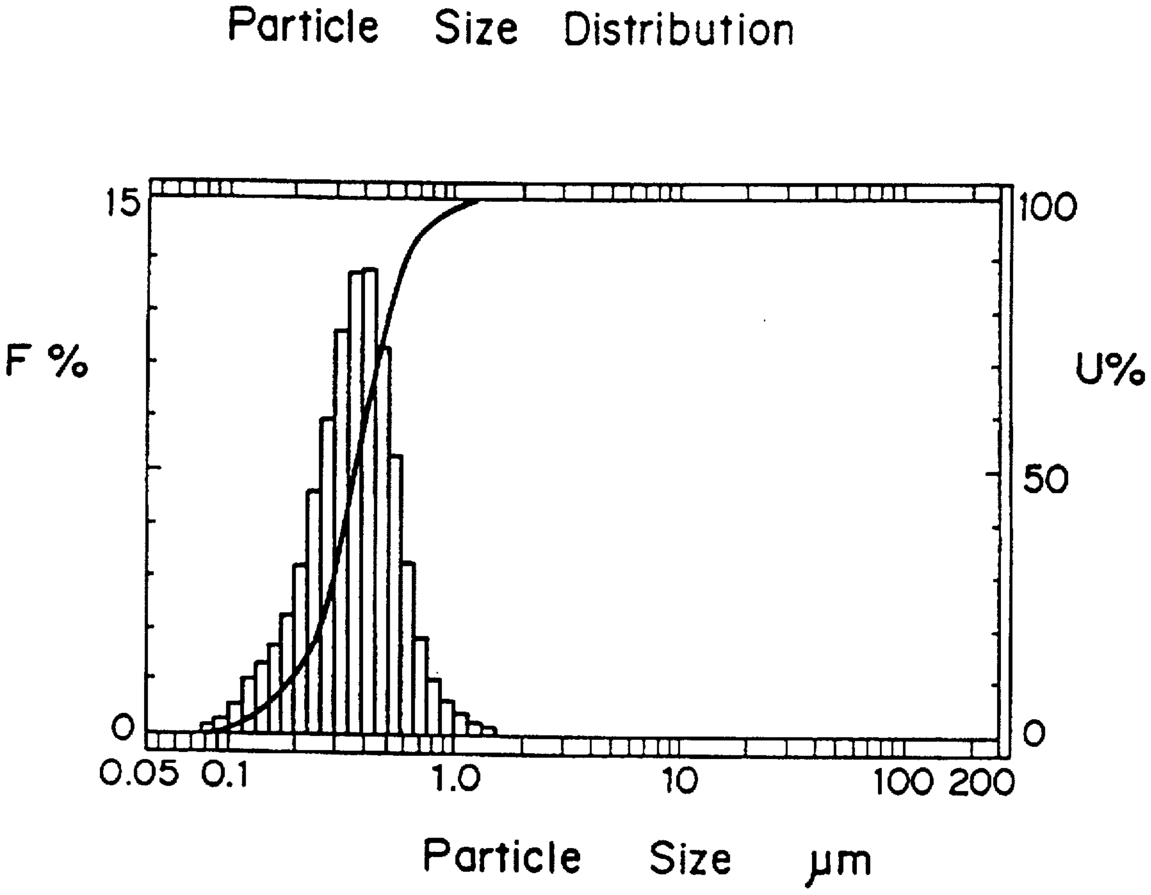
FIG. 2 shows a particle size distribution of magenta pigment employed in Example 1.

The particle size distribution of the pigments in the dispersions are shown in the attached figures, wherein FIG. 1 indicates the distribution of cyan pigment; FIG. 2 indicates the distribution of magenta pigment; and FIG. 3 indicates the distribution of yellow pigment. In each figure, the axis of abscissas indicates particle size (μm), the left axis of ordinates indicates percentage (%) of particles of the indicated particle sizes, and the right axis of ordinates indicates accumulated percentage (%).

Figure 3:
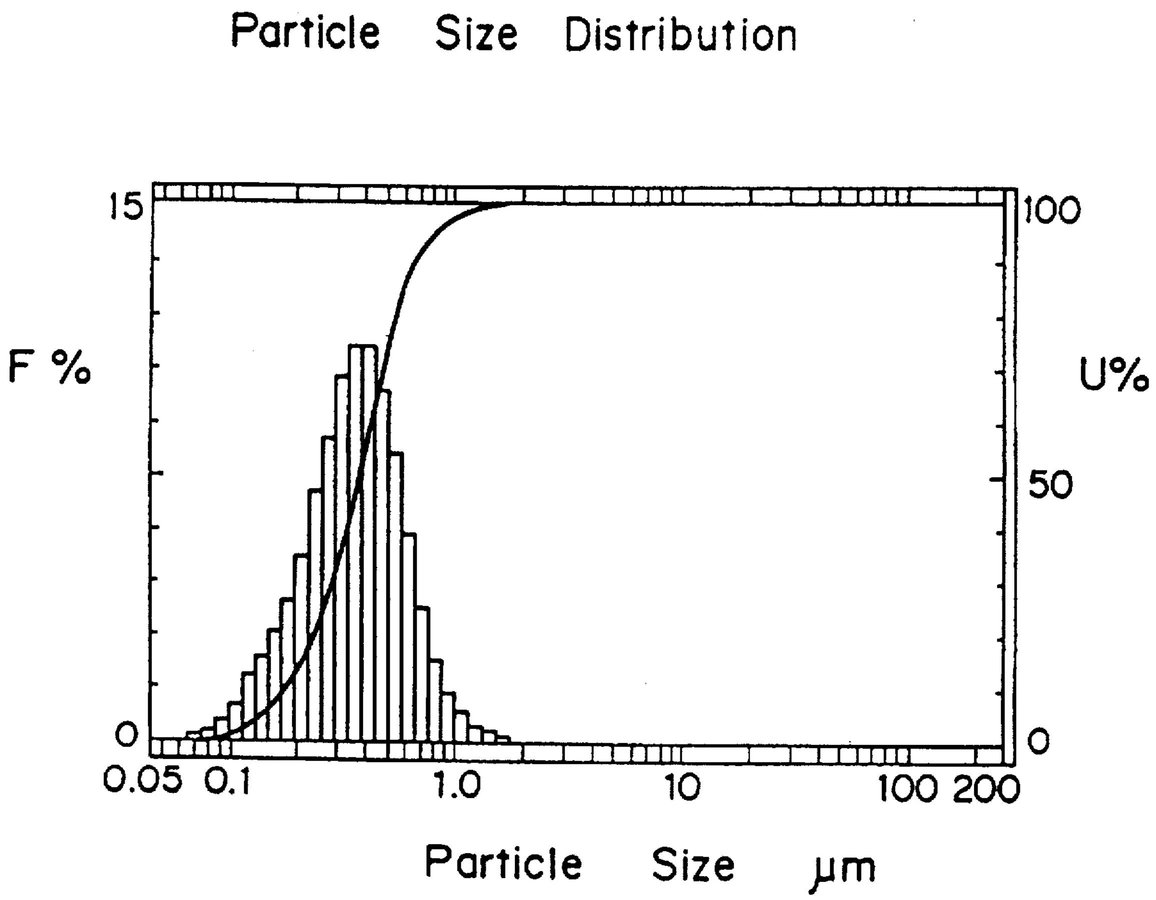
FIG. 3 shows a particle size distribution of yellow pigment employed in Example 1.

In FIG. 1, a median size of the particles is 0.154 μm, the specific surface is 422, 354 $cm^2/cm^3$, and 90% of the total particles have particle sizes of not less than 0.252 μm. In FIG. 2, a median size of the particles is 0.365 μm, the specific surface is 189, 370 $cm^2/cm^3$, and 90% of the total particles have particle sizes of not less than 0.599 μm. In FIG. 3, a median size of the particles is 0.364 μm, the specific surface is 193, 350 $cm^2/cm^3$, and 90% of the total particles have particle sizes of not less than 0.655 μm.

To 10 parts of each pigment dispersion were added 0.24 part of N-hydroxyethyl-12-hydoxystearic amide, 0.01 part of a surface active agent (Megafack F-177, available from Dainippon Ink & Chemicals Inc.) and 60 parts of n-propyl alcohol to give a coating liquid. Each of thus obtained coating liquids [A), B) and C) corresponding to the pigment dispersions A), B) and C)] was coated using a whirler on a polyester film (base sheet; thickness: 5 μm, available from Teijin Co., Ltd.) with a back surface having been made easily releasable. Thus, a cyan ink sheet having a base sheet and a cyan ink layer of 0.36 μm, a magenta ink sheet having a base sheet and a magenta ink layer of 0.38 μm, and a yellow ink sheet having a base sheet and a yellow ink layer of 0.42 μm, were prepared.

COMPARISON EXAMPLE 1

The procedures of Example 1 were repeated except for employing dibutyloctyl phthalate (DOP, Daihachi Kagaku Co., Ltd.) instead of Polycizer-W-20 as a plasticizer for preparing an intermediate layer, to prepare an image receiving sheet. Heat sensitive ink sheets (cyan ink sheet, magenta ink sheet and yellow ink sheet) were prepared in the same manner as Example 1.

[Image formation using thermal head and its evaluation]

Using the image receiving sheet and the heat sensitive ink sheets obtained in Example 1 and Comparison Example 1, the image formation was performed as follows:

(1) Formation of transferred image (Step 1)

Initially, the cyan heat sensitive ink sheet was superposed on the image receiving sheet, and a thermal head was placed on the cyan ink sheet side for imagewise forming a cyan image by the known divided sub-scanning method. The divided sub-scanning method was performed with multiple modulation for giving area gradation by moving a thermal head of 75 μm×50 μm in one direction at a pitch of 3 μm along 50 μm length. The base sheet (polyester film) of the cyan ink sheet was then peeled off from the image receiving sheet on which a cyan image with area gradation was maintained. On the image receiving sheet having the cyan image was superposed the magenta ink sheet with registering these sheets, and the same procedure was repeated for forming a magenta image with area gradation on the image receiving sheet having the cyan image. The yellow ink sheet was then superposed on the image receiving sheet having the cyan and magenta images thereon in the same manner, and the same procedure was repeated for forming a yellow image with area gradation on the image receiving sheet. Thus, a multicolor image was formed on the image receiving layer.

(2) Evaluation of color image obtained in Step 1

The color images obtained in Step 1 under ordinary conditions or varied conditions were evaluated on heat sensitivity and fog.

1) Heat sensitivity under ordinary conditions

Heat sensitivity of color image obtained under ordinary conditions (25° C., 50% RH) was evaluated. The sensitivity was determined depending on degree of density in gray scale area (size of dot), i.e., increased sensitivity gave an increased size of dot to increase of density of dot image.

Heat sensitivity was ranked based on evaluation of multicolor image (EE) obtained ordinary conditions (25° C., 50% RH) in Comparison Example 1, as follows:

(Sensitivity)

AA: Extremely high compared with sensitivity of Comparison Example 1

BB: High compared with sensitivity of Comparison Example 1

CC: A little high compared with sensitivity of Comparison Example 1

DD: Slightly high compared with sensitivity of Comparison Example 1

2) Fog under ordinary conditions

Degree of fog produced on the image obtained under ordinary conditions (25° C., 50% RH) was evaluated. The degree of fog was determined depending on density in non-image portion.

Degree of dot was ranked as follows:

(Fog)

AA: There was little fog

BB: There was slight fog

CC: There was a little fog

DD: There was fog

EE: There was much fog

3) The color image obtained in Step 1 under the conditions of 22° C., 40% RH was evaluated on heat sensitivity and fog in the same manner above 1) and 2).

4) The color image obtained in Step 1 under the conditions of 26° C., 60% RH was evaluated on heat sensitivity and fog in the same manner above 1) and 2).

The results of these evaluation are set forth in Table 1.

TABLE 1

| | Plasticizer | 25° C./50% RH Sensitivity | Fog | 22° C./40% RH Sensitivity | Fog | 26° C./60% RH Sensitivity | Fog |
|---|---|---|---|---|---|---|---|
| Ex. 1 | Oligomer having phthalate unit | AA | AA | AA | AA | AA | BB |
| Co. Ex. 1 | DOP | EE | AA | EE | AA | CC | DD |

As is apparent from the results of Table 1, the image forming method using the image receiving sheet containing the specific plasticizer (Example 1) gave transferred images having high quality. In more detail, the images almost free from occurrence of fog were obtained with keeping high sensitivity under the various conditions (of various temperatures and humidities).

EXAMPLE 2

An image receiving sheet and heat sensitive ink sheets were prepared below. Then, a composite of a heat sensitive sheet and an image receiving sheet was irradiated with a laser beam to form a transferred image in the following manner.

(1) Preparation of image receiving sheet

The coating liquid for intermediate layer were prepared by mixing the following components by the use of a stirrer:

| (Coating liquid for intermediate layer) | |
|---|---|
| Vinyl chloride/vinyl acetate copolymer (MPR-TSL, available from Nisshin Chemical Co., Ltd.) | 445.0 parts |
| Acrylic rubber (RS-08, available from Nisshin Chemical Co., Ltd.) | 220.9 parts |
| Oligomer having phthalate unit (Polycizer-W-20, weight-average molecular weight: 1,000, available from Dainippon Ink & Chemicals Inc.) | 218.4 parts |
| Stabilizer (Mixture of di-(n-octyl)tin-S,S'-bis(isooctylmercapto acetate) and n-octyltin-S,S'-bis(isooctylmercapto acetate); KS-2000A, available from Kyodo Yakuhin Kogyo Co., Ltd.) | 3.28 parts |
| Surface active agent (Megafack F-177, available from Dainippon Ink & Chemicals Inc.) | 6.55 part |
| Toluene | 110.0 parts |

-continued

| (Coating liquid for intermediate layer) | |
|---|---|
| Methyl ethyl ketone | 1361.4 parts |
| N,N-dimethylformamide | 39.3 parts |

The above coating liquid for intermediate layer was coated on a polyester film (support sheet; thickness: 100 μm) using a whirler, and dried for 5 minutes in an oven of 100° C. to form an intermediate layer (thickness: 23 μm) on the film.

The coating liquid for image receiving layer were prepared by mixing the following components by the use of a stirrer:

| (Coating liquid for image receiving layer) | |
|---|---|
| Butyral resin (Denka Butyral #2000-L, available from Denki Kagaku Kogyo K.K.) | 125.3 parts |
| N,N-dimethylacrylamide/butyl acrylate copolymer (50/50, molar ratio) | 31.3 parts |
| Surface active agent (Megafack F-177, available from Dainippon Ink & Chemicals Inc.) | 0.79 part |
| n-Propyl alcohol | 1643.4 parts |
| 1-Methoxy-2-propanol | 94.0 parts |

Subsequently, the above coating liquid for image receiving layer was coated on the intermediate layer using a whirler, and dried for 2 minutes in an oven of 100° C. to form a image receiving layer (thickness: 2 μm).

(2) Preparation of heat sensitive ink sheet

1) Preparation of coating liquid for light-heat conversion layer

The following components were mixed using a stirrer to prepare a coating liquid for light-heat conversion layer:

| | |
|---|---|
| Cyanine dye abosrbing infrared rays of the following structure: | 0.3 part |

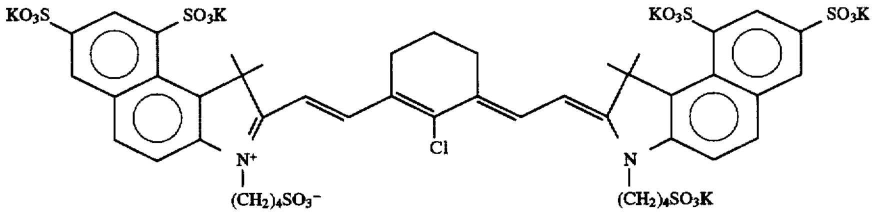

| | |
|---|---|
| 5% Aqueous solution of polyvinyl alcohol (#205, available from Kuraray Co., Ltd.) | 6.0 parts |
| Isopropyl alcohol | 5.0 parts |
| Ion exchanged water | 20.0 parts |
| Dye abosrbing infrared ray | 1.7 part |

-continued

| | |
|---|---|
| (IR-820, available from Nippon Kayaku Co., Ltd.) | |
| Varnish of polyamic acid | 13.0 parts |
| (PAA-A, available from Mitsui Toatsu Chemicals, Inc.) | |
| 1-Methoxy-2-propanol | 60.0 parts |
| Methyl ethyl ketone | 88.0 parts |
| Surface active agent | 0.05 parts |
| (Megafack F-177, available from Dainippon Ink & Chemicals Inc.) | |

2) Formation of light-heat conversion layer

A first subbing layer comprising styrene/butadiene copolymer (thickness: 0.5 μm) and a second subbing layer comprising gelatin (thickness: 0.1 μm) were formed on a polyethylene terephthalate film (base sheet; thickness: 75 μm) in order. Then, the above coating liquid for light-heat conversion layer was coated on the second subbing layer using a whirler, and dried for 2 minutes in an oven of 100° C. to form a light-heat conversion layer (thickness: 0.2 μm (measured by feeler-type thickness meter, absorbance of light of 830 nm: 1.4)).

3) Preparation of coating liquid for heat sensitive peeling layer

The following components were mixed using a stirrer to prepare a coating liquid for heat sensitive peeling layer:

| | |
|---|---|
| Nitrocellulose | 1.3 part |
| (HIG120, available from | |
| Asahi Chemical Co., Ltd.) | |
| Methyl ethyl ketone | 26.0 parts |
| Propylene glycol monomethylether acetate | 40.0 parts |
| Toluene | 92.0 parts |
| Surface active agent | 0.01 part |
| (Megafack F-177, available from | |
| Dainippon Ink & Chemicals Inc.) | |

4) Formation of heat sensitive peeling layer

The above coating liquid for heat sensitive peeling layer was coated on the light-heat conversion layer using a whirler, and dried for 2 minutes in an oven of 100° C. to form a heat sensitive peeling layer (thickness: 0.1 μm (measured by feeler-type thickness meter a layer formed by coating the liquid on a surface of a hard sheet in the same manner as above)).

5) Preparation of coating liquid for heat sensitive ink layer (image forming layer) of magenta The following components were mixed using a stirrer to prepare a coating liquid for heat sensitive ink layer for magenta image:

Preparation of mother liquor

| | |
|---|---|
| Polyvinyl butyral | 12.6 parts |
| (Denka Butyral #2000-L available | |
| from Denki Kagaku Kogyo K.K.) | |
| Magenta pigments | 18 parts |
| (C.I. P.R.57:1) | |
| Dispersing agent | 0.8 part |
| (Solspers S-20000, | |
| available from ICI Japan Co., Ltd.) | |
| n-Propyl alcohol | 110.0 parts |
| Glass beads | 100.0 parts |

The above materials were placed in a paint shaker (available from Toyo Seiki Co., Ltd.) and were subjected to dispersing treatment for two hours to prepare the mother liquor. The obtained mother liquor was diluted with n-propyl alcohol, and particle size distribution of the pigments in the diluted liquid was measured by a particle size measuring apparatus (utilizing laser beam scattering system). The measurement showed that the pigments of not less than 70 weight % had particle size of 180 to 300 nm.

Preparation of coating liquid

| | |
|---|---|
| Mother liquor prepared above | 6.0 parts |
| n-Propyl alcohol | 60.0 parts |
| Surface active agent | 0.01 part |
| (Megafack F-177, available from | |
| Dainippon Ink & Chemicals Inc.) | |

The above components were mixed with a stirrer to prepare a coating liquid for forming heat sensitive ink layer of magenta.

6) Formation of heat sensitive ink layer of magenta

The above coating liquid for heat sensitive ink layer of magenta image was coated on the heat sensitive peeling layer using a whirler, and dried for 2 minutes in an oven of 100° C. to form a heat sensitive ink layer (thickness: 0.3 μm (measured by feeler-type thickness meter a layer formed by coating the liquid on a surface of a hard sheet in the same manner as above)). The obtained ink layer showed optical transmission density of 0.7 (measured by Macbeth densitometer using green filter).

Thus, a heat sensitive ink sheet (magenta image) composed of a base sheet, a light-heat conversion layer, a heat sensitive peeling layer and heat sensitive ink layer of magenta image, was prepared.

EXAMPLE 3

(1) Preparation of image receiving sheet

The coating liquid for image receiving layer was prepared by mixing the following components by the use of a stirrer:

| (Coating liquid for image receiving layer) | |
|---|---|
| Butyral resin (Denka Butyral #2000-L, available | 125.3 parts |
| from Denki Kagaku Kogyo K.K.) | |
| N,N-dimethylacrylamide/butyl acrylate copolymer | 31.3 parts |
| (50/50, molar ratio) | |
| Surface active agent | 0.79 part |
| (Megafack F-177, available from | |
| Dainippon Ink & Chemicals Inc.) | |
| Oligomer having phthalate unit | 12.5 parts |
| (Polycizer-W-20, weight-average molecular | |
| weight: 1,000, available from | |
| Dainippon Ink & Chemicals Inc.) | |
| n-Propyl alcohol | 1643.4 parts |
| 1-Methoxy-2-propanol | 94.0 parts |

The above coating liquid for image receiving layer was coated on a polyester film (support sheet) (thickness: 100 μm) using a whirler, and dried for 2 minutes in an oven of 100° C. to form a image receiving layer (thickness: 2 μm) on the film. Thus an image receiving sheet was prepared.

A heat sensitive ink sheet (magenta) was prepared in the same manner as Example 2.

COMPARISON EXAMPLE 2

An image receiving sheet was prepared in the same manner as Comparison Example 1. A heat sensitive ink sheet (magenta) was prepared in the same manner as Example 2.

[Formation of image by laser beam and evaluation]

(3) Preparation of composite for forming image

The heat sensitive ink sheet and the image receiving sheet were allowed to stand at room temperature for one day, and they were placed at room temperature in such a manner that the heat sensitive ink layer and the image receiving layer came into contact with each other and passed through a couple of heat rollers under conditions of 70° C., 4.5 kg/cm$^2$ and 2 m/sec. to form a composite. Temperatures of the sheets when passed through the rollers were measured by a thermocouple. The temperatures each were approx. 50° C.

(4) Fixation of composite on image forming device

The above composite was cooled at room temperature for 10 minutes. Then, the composite was wound around a rotating drum provided with a number of suction holes in such a manner that the image receiving sheet was in contact with a surface of the rotating drum, and the composite was fixed on the rotating drum by sucking inside of the drum.

(5) Image recording

The laser beam (λ: 830 nm, out-put power: 110 mW) was focused at a beam diameter of 7 μm on the surface of the light-heat conversion layer of the composite to record a image (line), while, by rotating the drum, the laser beam was moved in the direction (sub-scanning direction) perpendicular to the rotating direction (main-scanning direction).

Main-scanning rate: 10 m/sec.

Sub-scanning pitch (Sub-scanning amount per one time): 5 μm (6) Formation of transferred image The recorded composite was removed from the drum, and the heat sensitive ink sheet was peeled off from the image receiving sheet by hand to obtain the image receiving sheet having the transferred image (lines) of the heat sensitive ink material wherein lines of magenta having width of 5.0 μm were formed in only the irradiation portion of the laser beam.

[Evaluation of formed image]

The magenta image obtained in the procedure of formation of image under ordinary conditions or varied conditions was evaluated on heat sensitivity and fog in the same manner as above.

1) Heat sensitivity under ordinary conditions

Heat sensitivity of the image obtained in the procedure of formation of image under ordinary conditions (25° C., 50% RH) was ranked based on evaluation of magenta image (EE) obtained under the ordinary conditions in Comparison Example 2, as follows:

(Sensitivity)

AA: Extremely high compared with sensitivity of Comparison Example 2

BB: High compared with sensitivity of Comparison Example 2

CC: A little high compared with sensitivity of Comparison Example 2

DD: Slightly high compared with sensitivity of Comparison Example 2

2) Fog under ordinary conditions

Degree of dot was ranked as follows:

(Fog)

AA: There was little fog

BB: There was slight fog

CC: There was a little fog

DD: There was fog

EE: There was much fog

3) The magenta image obtained in the procedure of formation of image under the conditions of 22° C., 40% RH was evaluated on heat sensitivity and fog in the same manner above 1) and 2).

4) The magenta image obtained in the procedure of formation of image under the conditions of 26° C., 60% RH was evaluated on heat sensitivity and fog in the same manner above 1) and 2).

The results of these evaluation are set forth in Table 2.

TABLE 2

| | Plasticizer | 25° C./50% RH Sensitivity | Fog | 22° C./40% RH Sensitivity | Fog | 26° C./60% RH Sensitivity | Fog |
|---|---|---|---|---|---|---|---|
| Ex. 2 | Oligomer having phthalate unit (in intermediate layer) | AA | AA | AA | AA | AA | BB |
| Ex. 3 | Oligomer having phthalate unit (in image receiving layer) | AA | AA | AA | AA | AA | CC |
| Co. Ex. 2 | DOP (in intermediate layer) | EE | AA | EE | AA | CC | DD |

As is apparent from the results of Table 2, the image forming method using the image receiving sheets which have the intermediate layer (Example 2) and the image receiving layer (Example 3) containing the specific plasticizer gave transferred images having high quality. In more detail, the images almost free from occurrence of fog were obtained with keeping high sensitivity under the various conditions (of various temperatures and humidities).

What is claimed is:

1. An image receiving sheet comprising a support sheet, an intermediate layer thereon and an image receiving layer provided on the intermediate layer, wherein the intermediate layer comprises a polymer and a plasticizer having at least one ester bond and a weight-average molecular weight of 700 to 3,000.

2. The image receiving sheet as defined in claim 1, wherein the plasticizer is an oligomer having phthalic acid ester unit of the following chemical structure (1):

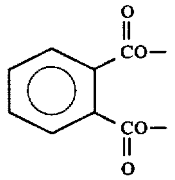

(1)

3. The image receiving sheet as defined in claim 1, wherein the polymer is at least one polymer selected from the group consisting of polyvinyl chloride, vinyl chloride/vinyl acetate copolymer, vinyl chloride/vinyl alcohol copolymer and vinyl chloride/vinyl acetate/maleic acid copolymer.

4. The image receiving sheet as defined in claim 1, wherein the polymer in the intermediate layer is in an amount of 50 to 95 weight % and the plasticizer in the intermediate layer is an amount of 5 to 50 weight %.

5. The image receiving sheet as defined in claim 1, wherein the image receiving layer comprises at least one polymer selected from the group consisting of polyvinyl butyral and alkyl acrylate/acrylamide copolymer.

6. A composite in which comprises the image receiving sheet of claim 1 and a heat sensitive ink sheet comprising a base sheet and a heat sensitive ink layer thereon which are superposed in such a manner that the heat sensitive ink layer is in contact with the image receiving layer, said heat sensitive ink layer of the heat sensitive ink sheet having a thickness of 0.2 to 1.5 μm and being formed of a heat sensitive ink material comprising 30 to 70 weight % of colored pigment and 25 to 65 weight % of amorphous organic polymer having a softening point of 40° to 150° C.

7. An image forming method which comprises the steps of:

superposing a heat sensitive ink sheet comprising a base sheet and a heat sensitive ink layer thereon formed of heat sensitive ink material on the image receiving layer of the image receiving sheet of claim 1;

placing imagewise a thermal head on the base sheet of the heat sensitive ink sheet to form an image of the ink material with area gradation on the image receiving layer; and separating the base sheet of the heat sensitive ink sheet from the image receiving sheet so that the image of the ink material is retained on the image receiving layer.

8. The image receiving sheet as defined in claim 4, wherein the polymer in the intermediate layer is present in an amount of 60 to 90 weight % and the plasticizer in the intermediate layer is present in an amount of 10 to 40 weight %.

9. The image receiving sheet as defined in claim 1, wherein the intermediate layer has a thickness of 1 to 50 μm.

10. The image receiving sheet as defined in claim 1, wherein the image receiving layer has a thickness of 0.1 to 10 μm.

11. The image receiving sheet as defined in claim 1, wherein the plasticizer has a weight average molecular weight of 800 to 2500.

* * * * *